(12) United States Patent
Horikawa et al.

(10) Patent No.: US 9,324,929 B2
(45) Date of Patent: Apr. 26, 2016

(54) WIRING SUBSTRATE

(71) Applicant: Shinko Electric Industries Co., Ltd, Nagano-ken (JP)

(72) Inventors: Yasuyoshi Horikawa, Nagano (JP); Tatsuaki Denda, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/689,444

(22) Filed: Apr. 17, 2015

(65) Prior Publication Data

US 2015/0311417 A1 Oct. 29, 2015

(30) Foreign Application Priority Data

Apr. 24, 2014 (JP) ................................ 2014-090540

(51) Int. Cl.
*H01L 33/64* (2010.01)
*H01L 33/62* (2010.01)
*H05K 1/02* (2006.01)
*H05K 3/10* (2006.01)
(Continued)

(52) U.S. Cl.
CPC .............. *H01L 33/642* (2013.01); *H01L 33/60* (2013.01); *H01L 33/62* (2013.01); *H01L 33/647* (2013.01); *H05K 1/0204* (2013.01); *H05K 1/0206* (2013.01); *H01L 33/641* (2013.01); *H01L 2224/16225* (2013.01); *H01L 2924/15192* (2013.01); *H05K 1/0207* (2013.01); *H05K 1/18* (2013.01); *H05K 2201/10106* (2013.01)

(58) Field of Classification Search
CPC ......... H01L 33/52; H01L 33/60; H01L 33/62; H01L 33/641; H01L 33/642; H01L 33/647

USPC ................ 257/88, 89, 98, 675, 778, E21.511, 257/E23.069, E23.079, E25.013, E33.072, 257/E33.075; 361/712, 783; 438/27, 118, 438/161; 174/252, 257

See application file for complete search history.

(56) References Cited

U.S. PATENT DOCUMENTS 7,148,554 B2 * 12/2006 Nah ..................... H05K 1/0206
257/528
8,937,390 B2 * 1/2015 Hisano ................ H01L 23/3128
257/532
2007/0057364 A1 * 3/2007 Wang ........................ C03C 8/02
257/701

(Continued)

FOREIGN PATENT DOCUMENTS

JP 2004-039691 2/2004
JP 2008-270326 11/2008

(Continued)

*Primary Examiner* — Dao H Nguyen
(74) *Attorney, Agent, or Firm* — Fish & Richardson P.C.

(57) ABSTRACT

A wiring substrate includes a heat sink, an insulation layer, first and second wiring layers, first and second through wirings, and first and second pads. The insulation layer is arranged on the heat sink with an adhesive layer located in between. The insulation layer includes first and second through holes. The first and second wiring layers are arranged on a surface of the insulation layer in contact with the adhesive layer. The first and second wiring layers are embedded in the adhesive layer. The first through wiring formed in the first through hole is connected to the first wiring layer and thermally coupled to the semiconductor device. The second through wiring formed in the first through hole is connected to the second wiring layer and electrically connected to the semiconductor device. The pads cover exposed surfaces of the through wirings.

9 Claims, 7 Drawing Sheets

(51) Int. Cl.
*H01L 33/60* (2010.01)
*H05K 1/18* (2006.01)

(56) References Cited

U.S. PATENT DOCUMENTS

2012/0002420 A1* 1/2012 Imai ................ H01L 33/486
362/249.02

2014/0268574 A1* 9/2014 Itoi ................ H01L 23/5389
361/712

FOREIGN PATENT DOCUMENTS

| | | |
|---|---|---|
| JP | 2011-249574 | 12/2011 |
| JP | 2012-033855 | 2/2012 |
| JP | 2013-225643 | 10/2013 |

* cited by examiner

WIRING SUBSTRATE

CROSS-REFERENCE TO RELATED APPLICATIONS

This application is based upon and claims the benefit of priority from prior Japanese Patent Application No. 2014-090540, filed on Apr. 24, 2014, the entire contents of which are incorporated herein by reference.

FIELD

The present disclosure relates to a wiring substrate.

BACKGROUND

A recent semiconductor package including a semiconductor device uses an elastic wiring substrate, such as, a resin film. For example, a wiring substrate may include a semiconductor device generating a large amount of heat, such as a high-brightness light emitting device. Such a wiring substrate is bonded to a heat dissipation plate using an adhesive layer. The semiconductor device is connected to a wiring arranged on the upper surface of the wiring substrate. Thus, heat generated by the semiconductor device is transmitted from a via, which is formed by extending through the wiring substrate, to the heat dissipation plate through the adhesive layer (refer to, for example, Japanese Laid-Open Patent Publication Nos. 2013-225643, 2008-270326, 2004-039691, 2012-033855, and 2011-249574).

SUMMARY

However, in the adhesive layer, an improvement of the adhesiveness to the via increases the thermal resistance. This adversely affects the heat dissipation properties. Also, in the adhesive layer, an improvement of the thermal conductivity decreases the adhesion between the via and the adhesive layer. Such decreases in the adhesion may lower the reliability of the semiconductor package.

An aspect of the present disclosure is a wiring substrate on which one of a semiconductor and a module including a semiconductor device is mounted. The wiring substrate includes a heat dissipation plate, an insulation layer, a first wiring layer, a second wiring layer, a first through wiring, a second through wiring, a first pad, and a second pad. The insulation layer is arranged on the heat dissipation plate with an adhesive layer located in between. The insulation layer includes a first through hole and a second through hole that extend through the insulation layer in a thicknesswise direction. The first wiring layer and the second wiring layer are arranged on a surface of the insulation layer in contact with the adhesive layer. The first wiring layer and the second wiring layer are embedded in the adhesive layer. The first through hole of the insulation layer is filled with the first through wiring. The first through wiring is connected to the first wiring layer and thermally coupled to the semiconductor device. The second through hole of the insulation layer is filled with the second through wiring. The second through wiring is connected to the second wiring layer and electrically connected to the semiconductor device. The first pad covers a surface of the first through wiring exposed from the insulation layer. The first pad is provided in the surface opposite to the surface of the first through wiring in contact with the first wiring layer. The second pad covers a surface of the second through wiring exposed from the insulation layer. The second pad is provided in the surface opposite to the surface of the second through wiring in contact with the second wiring layer.

Other aspects and advantages of the disclosure will become apparent from the following description, taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the presently preferred embodiments together with the accompanying drawings in which.

DESCRIPTION OF THE EMBODIMENTS

Figure 1A:
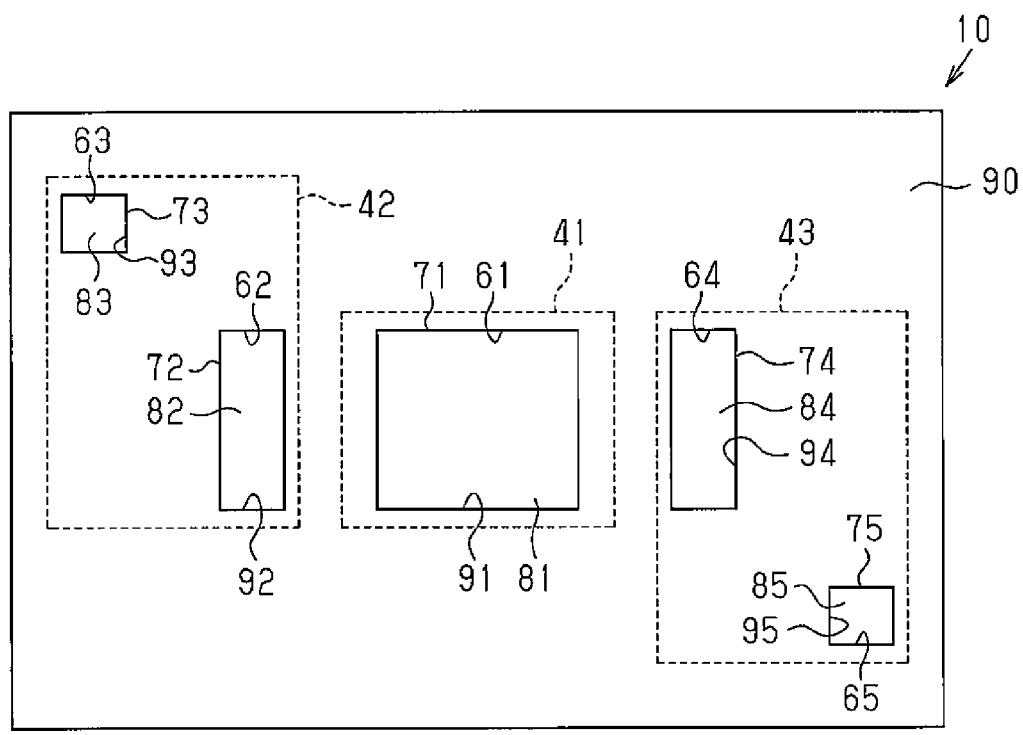
FIG. 1A is a schematic plan view of a first embodiment of a wiring substrate.

Each embodiment will now be described with reference to the accompanying drawings.

Elements in the drawings may be partially enlarged and thus have not necessarily been drawn to scale. In the cross-sectional views, hatching of some elements is omitted for clarity.

First Embodiment

A first embodiment will now be described.

Figure 1B:
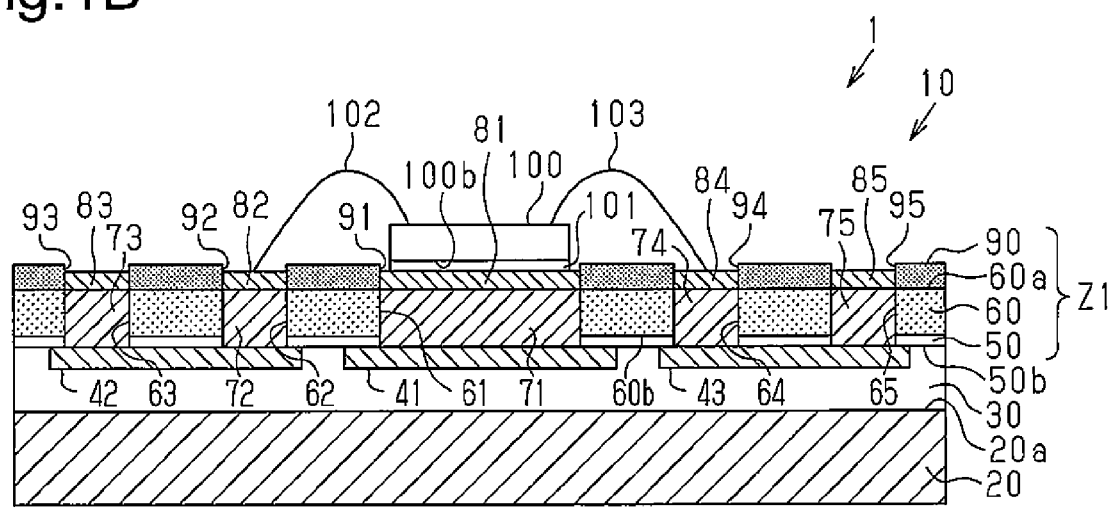
FIG. 1B is a schematic cross-sectional view of a semiconductor package in which a semiconductor device is mounted on the wiring substrate.

FIG. 1A is a schematic plan view of the first embodiment of a wiring substrate. FIG. 1B is a schematic cross-sectional view of a semiconductor package in which a semiconductor device is mounted on the wiring substrate.

As illustrated in FIG. 1B, a semiconductor package 1 includes a wiring substrate 10 and a semiconductor device 100 mounted on the wiring substrate 10.

The wiring substrate 10 includes a heat dissipation plate 20, an adhesive layer 30, wiring layers 41, 42, 43, an adhesive layer 50, an insulation layer 60, through wirings 71, 72, 73, 74, 75, pads 81, 82, 83, 84, 85, and a protection layer 90. In the wiring substrate 10, a portion including the wiring layers 41, 42, 43, the insulation layer 60, the through wirings 71 to 75, the pads 81 to 85, and the protection layer 90 may be referred to as a wiring portion Z1. That is, the wiring substrate 10 includes the heat dissipation plate 20 and the wiring portion Z1 that is connected to the heat dissipation plate 20 with the adhesive layer 30 located in between.

For the sake of convenience, in the first embodiment, a side of the protection layer 90 of the wiring substrate 10 is referred to as an upper side or a first side. A side of the heat dissipation plate 20 of the wiring substrate 10 is referred to as a lower side or a second side. Also, a surface of each component at the protection layer 90 side is referred to as an upper surface or a first surface. A surface of each component at the heat dissipation plate 20 side is referred to as a lower surface or a second surface. However, the wiring substrate 10 may be used upside-down or located at any angle. Additionally, a plan view refers to a view in which a subject is viewed in the normal direction from the first surface of the protection layer 90. A shape in a plan view refers to a shape of a subject as viewed in the normal direction from the first surface of the protection layer 90.

The heat dissipation plate 20 has, for example, a plate-like shape that is tetragonal in a plan view. The thickness of the heat dissipation plate 20 is, for example, 50 μm to 2 mm. For example, a metal having high thermal conductivity, such as copper (Cu) or aluminum (Al), may be used as the material of the heat dissipation plate 20. Alternatively, an alloy board containing a metal, such as copper or aluminum, may be used as the heat dissipation plate 20. Also, a board formed from an insulative material having high thermal conductivity, such as ceramics (e.g., alumina or aluminum nitride) or silicon, may be used as the heat dissipation plate 20.

The adhesive layer 30 is located on the heat dissipation plate 20 and in contact with the second surface of the insulation layer 60. The adhesive layer 30 bonds the insulation layer 60 (the wiring portion Z1) and the heat dissipation plate 20. In the first embodiment, specifically, the adhesive layer 50 is located below a lower surface 60b of the insulation layer 60. Thus, the insulating layer 60 is bonded on an upper surface 20a of the heat dissipation plate 20 via the adhesive layer 30 and the adhesive layer 50. For example, the thickness of the adhesive layer 30 may be approximately 20 to 200 μm. The adhesive layer 30 is part of a path through which the heat is transmitted from the semiconductor device 100 to the heat dissipation plate 20. Thus, it is preferred to use a high thermal conductive material for the adhesive layer 30. The material of the adhesive layer 30 may be, for example, a heat resistant adhesive formed from an insulative resin, such as, an epoxy adhesive, an acrylic adhesive, a silicone adhesive, an olefin adhesive, or a polyimide adhesive, containing a filler (e.g., alumina).

The insulation layer 60 is, for example, an elastic insulative resin film. It is preferred to use, for example, a high insulative film (tape), such as, a polyimide resin film or a polyester resin film (polyethylene terephthalate film or polyethylene naphthalate film). For example, the thickness of the insulation layer 60 is approximately 20 to 100 μm.

The adhesive layer 50 bonds the wiring layers 41 to 43 and the lower surface 60b of the insulation layer 60. The adhesive layer 50 and the adhesive layer 30 bond the lower surface 60b of the insulation layer 60 and the upper surface 20a of the heat dissipation plate 20. Thus, the wiring layers 41 to 43 are embedded in the adhesive layer 30. The material of the adhesive layer 50 may be, for example, a heat resistant adhesive formed from an insulative resin, such as, an epoxy adhesive, an acrylic adhesive, a silicone adhesive, an olefin adhesive, or a polyimide adhesive. For example, the thickness of the adhesive layer 50 is approximately 10 to 200 μm.

As illustrated in FIG. 1A, the wiring layers 41 to 43 are wirings that are electrically separated from one another. The wiring layers 41 to 43 are each tetragonal in a plan view. For example, the thickness of each of the wiring layers 41 to 43 is 10 to 150 μm. For example, copper (Cu) or the like may be used as the material of the wiring layers 41 to 43. For example, the wiring layers 41 to 43 are patterned by etching a metal foil formed from copper or the like.

As illustrated in FIG. 1B, the insulation layer 60 and the adhesive layer 50 include through holes 61 to 65 extending through in the thicknesswise direction. The through holes 61 to 65 include through wirings 71 to 75, respectively. Thus, each of the through wirings 71 to 75 extends through from an upper surface 60a of the insulation layer 60 to a lower surface 50b of the adhesive layer 50. The lower end of the through wiring 71 is connected to the wiring layer 41. The lower ends of the through wirings 72, 73 are connected to the wiring layer 42. In the same manner, the lower ends of the through wirings 74, 75 are connected to the wiring layer 43. As illustrated in FIG. 1A, the through wirings 71 to 75 are each tetragonal in a plan view. For example, copper (Cu) may be used as the material of the through wirings 71 to 75.

As illustrated in FIG. 1B, the pads 81 to 85 cover the upper surfaces (upper ends) of the through wirings 71 to 75, respectively. As illustrated in FIG. 1A, the pads 81 to 85 have the same (tetragonal) shape as the through wirings 71 to 75, respectively. The pads 81 to 85 are, for example, plating films. Alternatively, the pads 81 to 85 may undergo an organic solderability preservative (OSP) process to form OSP films. The pads 81 to 85 are connected to the semiconductor device 100 and a wiring material (e.g., bonding wire) in a favorable manner. The pads 81 to 85 also function as antioxidant films preventing oxidation of the through wirings 71 to 75.

The material of the plating film may be, for example, nickel (Ni), gold (Au), palladium (Pd), silver (Ag), or an alloy containing Ni, Au, Pd, or Ag. The plating film may have a single-layer structure or a multilayered structure. For example, the plating film may be formed by sequentially stacking an Ni or Ni-alloy film and an Au or Au-alloy film. Alternatively, an Ni or Ni-alloy film, a Pd or Pd-alloy film, and an Au or Au-alloy film may be used. As another option, an Ni or Ni-alloy film, a Pd or Pd-alloy film, an Ag or Ag-alloy film, and an Au or Au-alloy film may be used. Alternatively, an Ag or Ag alloy film may be used. Alternatively, an Ni or Ni-alloy film and an Ag or Ag-alloy film may be used. Alternatively, an Ni or Ni-alloy film, a Pd or Pd-alloy film, and an Ag or Ag-alloy film may be used.

Preferably, the Ni or Ni-alloy film contained in the plating film has a thickness of 0.5 μm or greater. Preferably, the Au or Au-alloy film contained in the plating film has a thickness of 0.1 μm or greater. Preferably, the Ag or Ag-alloy film contained in the plating film has a thickness of 0.1 μm or greater. Preferably, the Pd or Pd-alloy film contained in the plating film has a thickness of 0.005 μm or greater.

The protection layer 90 covers the upper surface 60a of the insulation layer 60. The protection layer 90 includes openings 91 to 95. The pads 81 to 85 are exposed from the openings 91 to 95, respectively. For example, the thickness of the protection layer 90 is approximately 20 to 100 μm. The material of the protection layer 90 may be, for example, an insulative resin, such as an epoxy resin or a silicone resin (e.g., organopolysiloxane). When the semiconductor device 100 is a light emitting device, the protection layer 90 may function as a reflection film reflecting light from the light emitting device.

The material of the protection layer 90 functioning as the reflection film may be, for example, an epoxy resin or a silicone resin (e.g., organopolysiloxane) containing a filler or a pigment (e.g., titanium oxide ($TiO_2$) or barium sulfate ($BaSO_4$)).

The semiconductor device 100 is mounted on the pad 81. For example, the semiconductor device 100 is mounted on the pad 81 with an adhesive layer 101 located in between. The adhesive layer 101 is, for example, a die attach film. The pads 82, 84 are each electrically connected to a terminal of the semiconductor device 100. In FIG. 1B, the pads 82, 84 each are connected to the terminal of the semiconductor device 100 using bonding wires 102, 103, respectively. The pads 83, 85 connect the semiconductor device 100 illustrated in FIG. 1B to a power supply, a drive circuit, or the like that are located at an outer side of the semiconductor package 1.

The wiring layers 41 to 43 and the through wirings 71 to 75 will now be described.

As illustrated in FIG. 1B, the wiring layer 41 is connected to the lower end of the through wiring 71. The pad 81 is formed on an upper surface of the through wiring 71. The pad 81 is connected to a lower surface 100b of the semiconductor device 100 via the adhesive layer 101. Thus, the wiring layer 41 of the first embodiment is a wiring (heat dissipation wiring) that is thermally coupled to the semiconductor device 100.

The pad 81 and the through wiring 71 are larger than the semiconductor device 100 (size in a plan view) in correspondence with the shape of the semiconductor device 100. This allows the semiconductor device 100 to be face-up-mounted on the pad 81 and the through wiring 71. In a plan view, a region in which the wiring layer 41 (heat dissipation wiring) is formed extends beyond a region of the pad 81 and the through wiring 71 (opening 91 of the protection layer 90). The pad 81 and the through wiring 71 are joined to a semiconductor device, a module, a heat dissipation terminal of a semiconductor device, or a heat dissipation terminal of a module. That is, the region in which the wiring layer 41 is formed is larger than the region of the pad 81 and the through wiring 71 in a plan view.

The wiring layer 42 is electrically connected to the lower end of the through wiring 72. The pad 82 is formed on the upper surface of the through wiring 72. The bonding wiring 102 connects the pad 82 and the corresponding terminal of the semiconductor device 100. In the same manner, the wiring layer 43 is electrically connected to the lower end of the through wiring 74. The pad 84 is formed on the upper surface of the through wiring 74. The bonding wire 103 connects the pad 84 and the corresponding terminal of the semiconductor device 100. Thus, the wiring layers 42, 43 are each an electric connection wiring that is electrically connected to the semiconductor device 100.

Figure 2:
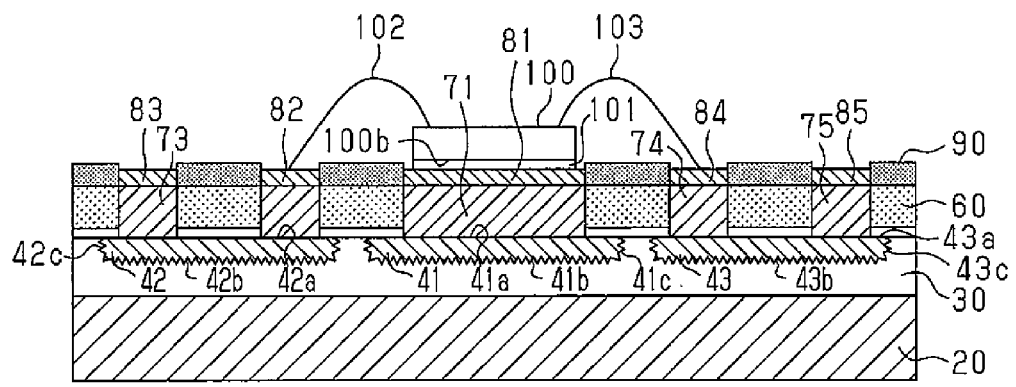
FIG. 2 is a schematic cross-sectional view of the semiconductor package.

For example, a metal foil, such as a copper foil, is patterned to form the wiring layers 41 to 43. Thus, it is easy to roughen surfaces of the wiring layers 41 to 43 compared to a metal layer formed by plating or the like. More specifically, as illustrated in FIG. 2, the wiring layer 41 includes a lower surface 41b and side surfaces 41c that are roughened and in contact with the adhesive layer 30. In the same manner, the wiring layer 42 includes a lower surface 42b and side surfaces 42c that are roughened and in contact with the adhesive layer 30. The wiring layer 43 includes a lower surface 43b and side surfaces 43c that are roughened and in contact with the adhesive layer 30. A roughening process may be performed by, for example, blackening, etching, plating, or blasting. The wiring layers 41, 42, 43 undergo the roughening process, for example, when applied to the insulation layer 60. The degree of roughness is represented by a surface roughness Ra value. In the wiring layers 41 to 43, the roughness degree of roughened surfaces, namely, the lower surfaces 41b, 42b, 43b and the side surfaces 41c, 42c, 43c, is higher than the roughness degree of surfaces (upper surfaces 41a, 42a, 43a) opposed to the insulation layer 60. In this manner, by roughening the surfaces of the wiring layers 41 to 43 that are in contact with the adhesive layer 30, the adhesion may increase between the wiring layers 41 to 43 and the adhesive layer 30.

One example of the procedures for manufacturing the wiring substrate 10 will now be briefly described.

For example, a reel (tape) of a film is prepared as the insulation layer 60. An adhesive or an adhesion film is applied to the lower surface 60b of the insulation layer 60 to form the adhesive layer 50. The through holes 61 to 65 extend through the insulation layer 60 and the adhesive layer 50, for example, by punching. A copper foil or the like is applied to the adhesive layer 50 to form a metal layer. Then, the adhesive layer 50 is cured by heating to a predetermined temperature. Subsequently, for example, by using an electrolytic plating process in which a metal layer functions as a power supply layer, the through holes 61 to 65 are filled with a plating metal to form the through wirings 71 to 75. The metal layer is patterned, for example, through wet etching, to form the wiring layers 41 to 43.

The protection layer 90 is formed on the upper surface 60a of the insulation layer 60. The protection layer 90 undergoes photolithography, blasting, laser cutting, or the like, to form the openings 91 to 95. The opening 91 to 95 expose the through wirings 71 to 75, respectively. For example, by using an electrolytic plating process or an electroless plating process, the pads 81 to 85 are formed on the upper surfaces (upper ends) of the through wirings 71 to 75. An adhesive or an adhesion film is applied to the upper surface 20a of the heat dissipation plate 20 to form the adhesive layer 30. The wiring portion Z1 is located on the adhesive layer 30 so that the wiring layers 41 to 43 are faced to the adhesive layer 30 side. The wiring layers 41 to 43 are embedded into the adhesive layer 30 below a predetermined temperature and a predetermined pressure. The adhesive layer 30 is cured by heating to a predetermined temperature. The wiring substrate 10 is formed through such procedures.

A comparative example of the wiring substrate 10 will now be described.

Figure 3:
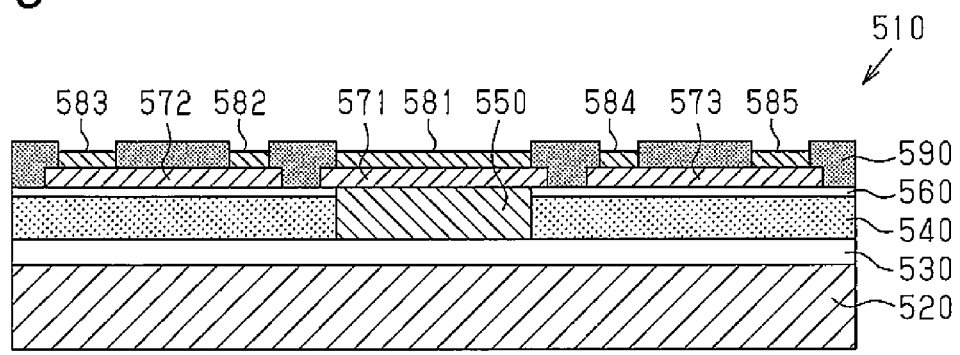
FIG. 3 is a schematic cross-sectional view of a comparative example of a wiring substrate.

As illustrated in FIG. 3, a comparative example of a wiring substrate 510 includes an insulation layer 540. Wiring layers 571 to 573 are separated from one another and located over the upper surface of the insulation layer 540 with an adhesive layer 560 arranged in between. A protection layer 590 is formed on the upper surface of the insulation layer 540. The protection layer 590 includes openings, which partially expose the wiring layers 571 to 573. Pads 581 to 585 are formed on the exposed portions of the wiring layers 571 to 573. The insulation layer 540 includes a through hole extending through in the thicknesswise direction and a through wiring 550 formed in the through hole. The wiring layer 571 is connected to the upper end of the through wiring 550. An adhesive layer 530 bonds the insulation layer 540 and the upper surface of a heat dissipation plate 520. A semiconductor device (not illustrated) is mounted on the upper surface of the pad 581. In the wiring substrate 510 of the comparative example, heat generated by the semiconductor device is transmitted to the heat dissipation plate 520 through the wiring layer 571, the through wiring 550, and the adhesive layer 530. The heat dissipation plate 520 dissipates the heat.

The comparative example uses only the through wiring 550 as a path through which heat is dissipated to the heat dissipation plate 520. Thus, the heat is concentrated to the through wiring 550, which may decrease the heat dissipation effect. This would increase the temperature of the mounted semiconductor device, thereby lowering the performance of the semiconductor device or the reliability of the semiconductor device. To improve the heat dissipation, the adhesive layer 530 would be thinned so that an end surface of the through wiring 550 is closer to the heat dissipation plate 520. In this case, a voltage is induced between the wiring layer 571 and the wiring layers 572, 573, which generates leak between the through wiring 550 and the heat dissipation plate 520. This may affect the insulation reliability.

The adhesive layer 560 bonds the insulation layer 540 and the wiring layers 571 to 573. The adhesive layer 560, which has high adhesion properties, has low insulation properties compared to the insulation layer 540. In FIG. 3, the protection layer 590 covers the adhesive layer 560. However, the adhesive layer 560 may be partially exposed. In the exposed adhesive layer 560, deterioration may adversely affect the insulation properties. Such adversely affected insulation properties cause a short circuit between wiring layers having a small gap.

The operation of the semiconductor package 1 (wiring substrate 10) will now be described.

The semiconductor device 100 mounted on the wiring substrate 10 operates in accordance with a drive voltage supplied from the power supply or the drive circuit located at the outer side of the semiconductor package 1. For example, the light emitting device emits light in accordance with a predetermined potential difference supplied between a cathode terminal and an anode terminal. This causes the semiconductor device 100 to generate heat. The heat generated by the semiconductor device 100 is transmitted to the wiring layer 41 through the pad 81 and the through wiring 71 and then from the wiring layer 41 to the heat dissipation plate 20 through the adhesive layer 30. Then, the heat dissipation plate 20 dissipates the heat.

The pad 81 and the through wiring 71 are larger than the semiconductor device 100 in a plan view. The wiring layer 41 has a plate-like shape and is larger than the through wiring 71 in a plan view. Thus, a contact area of the wiring layer 41 and the adhesive layer 30 is large compared to the comparative example illustrated in FIG. 3. Thus, the heat is efficiently transmitted from the semiconductor device 100 to the heat dissipation plate 20. The wiring layer 41, which is in contact with the adhesive layer 30, is formed, for example, by patterning a metal foil, such as copper. Additionally, the rough surfaces of the wiring layers 41 to 43 increase the adhesion. This limits the generation of delamination or the like.

At some locations, the adhesive layer 50 of the first embodiment is located between the insulation layer 60 and the wiring layers 41 to 43. At other locations, the adhesive layer 50 is located between the insulation layer 60 and the adhesive layer 30. Portions of the adhesive layer 50 exposed to the outer side are limited. Further, portions of the adhesive layer 50 that are proximate to the wiring layers 41 to 43 are not exposed to the outer side. Thus, the adhesive layer 50 is resistant to deterioration. This limits decreases in the reliability (e.g., adversely affected insulation properties and occurrence of a short circuit) caused by deterioration of the adhesive layer 50.

Accordingly, the first embodiment has the advantages described below.

(1-1) The wiring layer 41 is located on the lower surface 60b of the insulation layer 60 and embedded in the adhesive layer 30. The wiring layer 41 is thermally coupled to the semiconductor device 100 via the through wiring 71 formed in the through hole 61 of the insulation layer 60 and the pad 81 located on the upper end of the through wiring 71. The pad 81 and the through wiring 71 are larger than the semiconductor device 100 in a plan view. The wiring layer 41 has a plate-like shape and is larger than the through wiring 71 in a plan view. Thus, the contact area of the wiring layer 41 and the adhesive layer 30 is large compared to the comparative example illustrated in FIG. 3. This allows efficient heat transmission from the semiconductor device 100 to the heat dissipation plate 20.

(1-2) The wiring layer 41 is larger than the through wiring 71 in a plan view. Thus, heat may be dispersed from the through wiring 71 in the plane direction of the wiring layer 41 and dissipated to the heat dissipation plate 20 through the adhesive layer 30. Thus, the heat is not concentrated to the through wiring 71. This improves the heat dissipation, thereby ensuring the reliability of the semiconductor device. Since the wiring layer 41 decreases the heat concentration, there is no need to reduce the thickness of the adhesive layer 30. This ensures the insulation reliability.

(1-3) As illustrated in FIG. 2, the areas of the wiring layers 41 to 43 are larger than the area of the through wiring 550 illustrated in FIG. 3. The wiring layers 41 to 43 have the rough surfaces. Thus, the adhesion may be further increased. This limits the generation of delamination or the like, thereby limiting decreases in the reliability.

(1-4) At some locations, the adhesive layer 50 of the first embodiment is located between the insulation layer 60 and the wiring layers 41 to 43. At other locations, the adhesive layer 50 is located between the insulation layer 60 and the adhesive layer 30. Portions of the adhesive layer 50 exposed to the outer side are limited. Further, portions of the adhesive layer 50 that are proximate to the wiring layers 41 to 43 are not exposed to the outer side. Thus, the adhesive layer 50 is resistant to deterioration. This limits decreases in the reliability (e.g., adversely affected insulation properties and occurrence of a short circuit) caused by deterioration of the adhesive layer 50.

(1-5) The wiring substrate 10 of the first embodiment includes the two adhesive layers 30, 50. For example, the material having a superior adhesiveness may be selected for the adhesive layer 50. This prevents delamination resulting from stress generated in the wiring substrate 10. Additionally, the use of the two adhesive layers 30, 50 obtains the insulation reliability.

Second Embodiment

A second embodiment will now be described.

In the second embodiment, the same reference symbols are given to those components that are the same as the corresponding components of the first embodiment. Such components will not be described in detail.

Figure 4A:
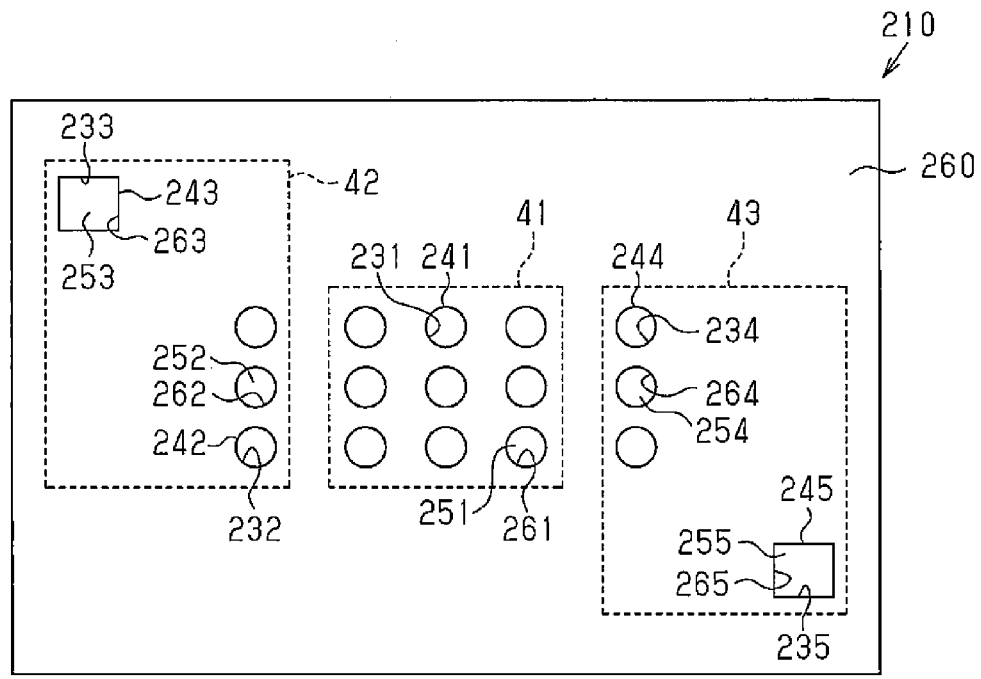
FIG. 4A is a schematic plan view of a second embodiment of a wiring substrate.
Figure 4B:
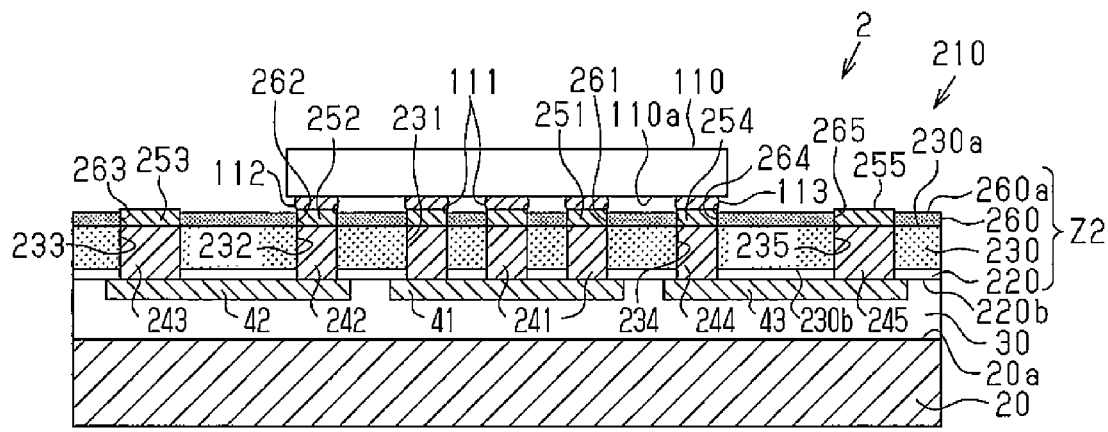
FIG. 4B is a schematic cross-sectional view of a semiconductor package in which a semiconductor device is mounted on the wiring substrate.

FIG. 4A is a schematic plan view of a second embodiment of a wiring substrate. FIG. 4B is a schematic cross-sectional view of a semiconductor package in which a semiconductor device is mounted on the wiring substrate.

As illustrated in FIG. 4B, a semiconductor package 2 includes a wiring substrate 210 and a semiconductor device 110 mounted on the wiring substrate 210.

The wiring substrate 210 includes the heat dissipation plate 20, the adhesive layer 30, the wiring layers 41 to 43, an adhesive layer 220, an insulation layer 230, through wirings 241, 242, 243, 244, 245, pads 251, 252, 253, 254, 255, and a protection layer 260. In the wiring substrate 210, a portion including the wiring layers 41 to 43, the insulation layer 230, the through wirings 241 to 245, the pads 251 to 255, and the protection layer 260 may be referred to as a wiring portion Z2.

That is, the wiring substrate 210 includes the heat dissipation plate 20 and the wiring portion Z2 that is connected to the heat dissipation plate 20 via the adhesive layer 30.

For the sake of convenience, in the second embodiment, a side of the protection layer 260 of the wiring substrate 210 is referred to as an upper side or a first side. A side of the heat dissipation plate 20 of the wiring substrate 210 is referred to as a lower side or a second side. Also, a surface of each component at the protection layer 260 side is referred to as an upper surface or a first surface. A surface of each component at the heat dissipation plate 20 side is referred to as a lower surface or a second surface. However, the wiring substrate 210 may be used upside-down or located at any angle. Additionally, a plan view refers to a view in which a subject is viewed in the normal direction from the first surface of the protection layer 260. A shape in a plan view refers to a shape of a subject as viewed in the normal direction from the first surface of the protection layer 260.

The insulation layer 230 is located on the heat dissipation plate 20 with the adhesive layer 30 arranged in between. The material of the insulation layer 230 may be the same as that of the insulation layer 60 of the first embodiment.

The adhesive layer 220 bonds the wiring layers 41 to 43 and a lower surface 230b. The lower surface 230b is a surface of the insulation layer 230 that is located at the lower side. The material of the adhesive layer 220 may be the same as that of the adhesive layer 50 of the first embodiment. The adhesive layer 220 and the adhesive layer 30 bond the lower surface 230b of the insulation layer 230 and the upper surface 20a of the heat dissipation plate 20. The wiring layers 41 to 43 are embedded in the adhesive layer 30.

As illustrated in FIG. 4A, the wiring layers 41 to 43 are wirings that are electrically separated from one another. The wiring layers 41 to 43 are each tetragonal in a plan view. For example, the wiring layers 41 to 43 are patterned by etching a metal foil formed from copper or the like.

As illustrated in FIG. 4B, the insulation layer 230 and the adhesive layer 220 include a plurality of through holes 231 extending through between an upper surface 230a of the insulation layer 230 and the lower surface 220b of the adhesive layer 220. That is, the through holes 231 extend from the upper surface 230a of the insulation layer 230 to the upper surface 41a of the wiring layer 41.

As illustrated in FIG. 4A, the through holes 231 are formed in correspondence with the mounted semiconductor device 110. The through holes 231 are arranged in a matrix layout in a plan view. Each through hole 231 is circular in a plan view. The through wiring 241 is formed in each through hole 231.

As illustrated in FIG. 4B, the insulation layer 230 and the adhesive layer 220 include through holes 232, 233 extending from the upper surface 230a of the insulation layer 230 to the upper surface 42a of the wiring layer 42. The through wiring 242 is formed in the through hole 232. The through wiring 243 is formed in the through hole 233.

As illustrated in FIG. 4A, a plurality (three in the drawing) of the through holes 232 and the through wirings 242 are arranged in a straight line. The through holes 232 and the through wirings 242 are each circular in a plan view. The second embodiment includes the single through hole 233 and the single through wiring 243. The through hole 233 and the through wiring 243 are tetragonal in a plan view. The through holes 232 and the through wirings 242 are not limited in number and shape as illustrated in FIG. 4A and may be in any number or any shape. Also, the through holes 233 and the through wirings 243 are not limited in number and shape as illustrated in FIG. 4A and may be in any number or any shape.

In the same manner, as illustrated in FIG. 4B, the insulation layer 230 and the adhesive layer 220 include through holes 234, 235 extending from the upper surface 230a of the insulation layer 230 to the upper surface 43a of the wiring layer 43. The through wiring 244 is formed in the through hole 234. The through wiring 245 is formed in the through hole 235.

As illustrated in FIG. 4A, a plurality (three in the drawing) of the through holes 234 and the through wirings 244 are arranged in a straight line. The through holes 234 and the through wirings 244 are each circular in a plan view. The single through hole 235 and the single through wiring 245 are arranged. The through hole 235 and the through wiring 245 are tetragonal in a plan view. The through holes 234 and the through wirings 244 are not limited in number and shape as illustrated in FIG. 4A and may be in any number or any shape. Also, the through holes 235 and the through wirings 245 are not limited in number and shape as illustrated in FIG. 4A and may be in any number or any shape.

The material of the through wirings 241 to 245 may be the same as that of the through wirings 71 to 75 of the first embodiment (e.g., copper (Cu)). The through wirings 241 extend through the insulation layer 230 and the adhesive layer 220 in the thicknesswise direction. The through wirings 241 are connected to the wiring layer 41. The through wirings 242, 243 extend through the insulation layer 230 and the adhesive layer 220 in the thicknesswise direction. The through wirings 242, 243 are connected to the wiring layer 42. In the same manner, the through wirings 244, 245 extend through the insulation layer 230 and the adhesive layer 220 in the thicknesswise direction. The through wirings 244, 245 are connected to the wiring layer 43.

As illustrated in FIG. 4B, the pad 251 covers the upper surface of the through wiring 241. The pads 252, 253 cover the upper surfaces of the through wirings 242, 243, respectively. The pads 254, 255 cover the upper surfaces of the through wirings 244, 245, respectively.

As illustrated in FIG. 4A, the pad 251 and the through wiring 241 have the same (circular) shape in a plan view. The pads 252, 254 and the through wirings 242, 244 have the same (circular) shape in a plan view. The pads 253, 255 and the through wirings 243, 245 have the same (tetragonal) shape in a plan view. In the same manner as the through wirings 241 to 245, the pads 251 to 255 may be in any number. Also, each of the pads 251 to 255 is not limited to the shape that is the same as the corresponding one of the through wirings 241 to 245 and may be in any shape.

The material of the pads 251 to 255 may be the same as that of the pads 81 to 85 of the first embodiment. Thus, the pads 251 are connected to the semiconductor device 110 in a favorable manner. The pads 251 also function as antioxidant films preventing oxidation of the through wirings 241. Additionally, the pads 252, 253 are connected to the semiconductor device 110 and a wiring material (e.g., bonding wire) in a favorable manner. The pads 252, 253 also function as antioxidant films preventing oxidation of the through wirings 242, 243. The pads 254, 255 are connected to the semiconductor device 110 and a wiring material (e.g., bonding wire) in a favorable manner. The pads 254, 255 also function as antioxidant films preventing oxidation of the through wirings 244, 245.

The protection layer 260 covers the upper surface 230a of the insulation layer 230. The material of the protection layer 260 may be the same as that of the protection layer 90 of the first embodiment. The protection layer 260 includes openings 261 to 265. The pads 251 to 255 are exposed from the openings 261 to 265, respectively. In the second embodiment, the protection layer 260 is set to be thinner than the pads 251 to 255. Thus, the pads 251 to 255 project upward from the upper surface 260a of the protection layer 260.

The material of the protection layer 260 may be, for example, an insulative resin, such as an epoxy resin, a polyimide resin, or a silicone resin (e.g., organopolysiloxane). When the semiconductor device 110 is a light emitting device, the protection layer 260 may function as a reflection film reflecting light from the light emitting device.

The through wirings 241, 242, 244 and the pads 251, 252, 254 are located at positions in correspondence with terminals of the semiconductor device 110.

The semiconductor device 110 includes electric connection terminals and non-connection terminals (heat dissipation terminals), which are not illustrated in the drawing, on an device formation surface 110a (lower surface in the drawing). The electric connection terminal is connected to a circuit device (e.g., light emitting device) of the semiconductor device 110. The non-connection terminal is not electrically connected to the circuit device. The heat dissipation terminals are connected to the pads 251 via bumps 111. The electric connection terminals are electrically connected to the pads 252, 254 via bumps 112, 113 illustrated in FIG. 4B.

The operation of the semiconductor package 2 (wiring substrate 210) will now be described.

For example, when the semiconductor device 110 is a light emitting device, the electric connection terminals are the anode terminal and the cathode terminal. The semiconductor device 110, which is the light emitting device, emits light in accordance with a predetermined potential difference supplied between the two terminals. This causes the semiconductor device 110 to generate heat. The heat generated by the semiconductor device 110 is transmitted from the heat dissipation terminals to the wiring layer 41 through the bumps 111, the pads 251, and through wirings 241, and then from the wiring layer 41 to the heat dissipation plate 20 through the adhesive layer 30. Then, the heat dissipation plate 20 dissipates the heat. In other words, the semiconductor device 110 is thermally coupled to the wiring layer 42 embedded in the adhesive layer 30 via the bumps 111, the pads 251, and the through wirings 241.

In the same manner as the wiring substrate 10 of the first embodiment, the wiring substrate 210 of the second embodiment dissipates the heat generated by the semiconductor device 110 to the heat dissipation plate 20.

The pads 251 to 255, which cover the upper surfaces of the through wirings 241 to 245, project beyond the upper surface of the protection layer 260, which covers the insulation layer 230. The semiconductor device 110 is connected to the pads 251, 252, 254 via the bumps 111 to 113. If the protection layer 260 is located above the pads 251, 252, 254, the height of components connected to the pads 251, 252, 254, such as bumps, would need to be increased. Since the pads 251, 252, 254 project from the upper surface 260a of the protection layer 260, the semiconductor device 110 having a low connection terminal may be used.

Accordingly, the second embodiment has the advantages described below.

(2-1) The wiring layer 41 is located below the lower surface 230b of the insulation layer 230 and embedded in the adhesive layer 30. The wiring layer 41 is thermally coupled to the semiconductor device 110 via the through wirings 241 formed in the through holes 231 of the insulation layer 230 and the pads 251. Heat generated by the semiconductor device 110 is transmitted to the heat dissipation plate 20 through the pads 251, the through wirings 241, the wiring layer 41, and the adhesive layer 30. In the comparative example, the lower end of the through wiring 550 is in contact with only the adhesive layer 530. Thus, the through wiring 550 is a bottleneck in the heat transmission. However, in the second embodiment, the through wirings 241 and the wiring layer 41 are, for example, copper. Thus, the through wirings 241 and the wiring layer 41 have higher thermal conductivity than the adhesive layer 30. Additionally, the contact area between the wiring layer 41 and the adhesive layer 30 is larger than that of the comparative example illustrated in FIG. 3. Thus, the through wiring 241 of the second embodiment is not a bottleneck. This allows the efficient heat transmission.

(2-2) The wiring layer 41 is larger than the through wirings 241 in a plan view. Thus, heat may be dispersed from the through wirings 241 in the plane direction of the wiring layer 41 and dissipated to the heat dissipation plate 20 through the adhesive layer 30. Thus, the heat is not concentrated to the through wirings 241. This improves the heat dissipation, thereby ensuring the reliability of the semiconductor device. Since the wiring layer 41 decreases the heat concentration, there is no need to reduce the thickness of the adhesive layer 30. This ensures the insulation reliability.

(2-3) As illustrated in FIG. 2, the areas of the wiring layers 41 to 43 are larger than the area of the through wiring 550 illustrated in FIG. 3. The wiring layers 41 to 43 have the rough surfaces. Thus, the adhesion may be further increased. This limits the generation of delamination or the like, thereby limiting decreases in the reliability.

(2-4) At some locations, the adhesive layer 220 of the second embodiment is located between the insulation layer 230 and the wiring layers 41 to 43. At other locations, the adhesive layer 220 is located between the insulation layer 230 and the adhesive layer 30. Portions of the adhesive layer 220 exposed to the outer side are limited. Further, portions of the adhesive layer 220 that are proximate to the wiring layers 41 to 43 are not exposed to the outer side. Thus, the adhesive layer 220 is resistant to deterioration. This limits decreases in the reliability (e.g., adversely affected insulation properties) caused by deterioration of the adhesive layer 220.

(2-5) The wiring substrate 210 of the second embodiment includes the two adhesive layers 30, 220. For example, the material having a superior adhesiveness may be selected for the adhesive layer 220. This prevents delamination resulting from stress generated in the wiring substrate 210. Additionally, the use of the two adhesive layers 30, 220 obtains the insulation reliability.

(2-6) The pads 251 to 255 project from the upper surface 260a of the protection layer 260. The pads 251, 252, 254 are connected to the connection terminals (bumps 111, 112, 113) of the semiconductor device 110, which is face-down-mounted. If the protection layer 260 is located above the pads 251 to 255, the height of components connected to the pads 251, 252, 254, such as bumps, would need to be increased. Since the pads 251 to 255 project from the upper surface 260a of the protection layer 260, the semiconductor device 110 may have a low connection terminal.

Modified Example

A modified example of each of the above embodiments will now be described. The description and drawings hereafter correspond to the wiring substrate 10 of the first embodiment. However, the description and drawings may also be changed in correspondence with the second embodiment. In the description, the same reference symbols are given to those components that are the same as the corresponding components of the above embodiments. Such components will not be described in detail. Reference symbols of components that are not described may be omitted from the drawings.

Figure 5:
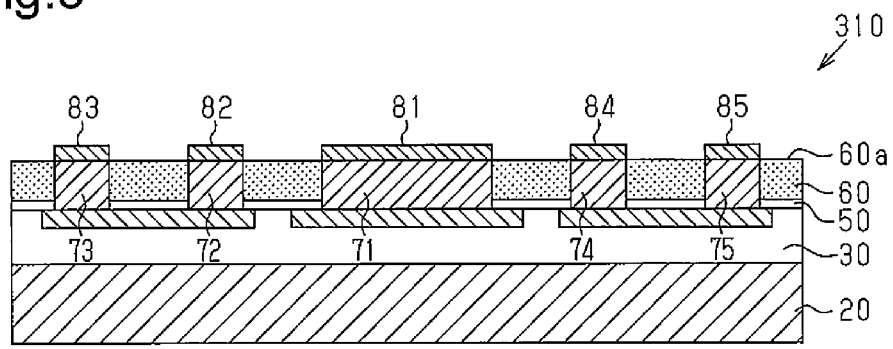
FIG. 5 is a schematic cross-sectional view of an example of a wiring substrate.

In a wiring substrate 310 illustrated in FIG. 5, the upper surface 60a of the insulation layer 60 is exposed. That is, the protection layer 90 in the wiring substrate 10 of FIG. 1 is omitted from the wiring substrate 310. The wiring substrate 310 is used, for example, when coupling a semiconductor device having no light emitting function or a light emitting semiconductor device that needs no reflection function. The wiring substrate 310 does not include the protection layer 90. This shortens the time and reduces costs needed for manufacturing the wiring substrate 310. Additionally, in the same manner as the second embodiment, when the semiconductor device 110 is face-down-mounted, the connection terminal (e.g., bump) of the semiconductor device 110 may have a smaller projection since there is no the protection layer 90.

In the wiring substrate 10 of the first embodiment and the wiring substrate 310 illustrated in FIG. 5, the adhesive layer 50 is located between the insulation layer 60 and the adhesive layer 30. In other words, the insulation layer 60 and the adhesive layer 30 cover two opposite surfaces of the adhesive layer 50. Thus, as illustrated in FIG. 5, even in the wiring substrate 310 having no protection layer 90, the adhesive layer 50 does not deteriorate. This also applies to the adhesive layer 220 of the second embodiment in the same manner as the adhesive layer 50.

Figure 6:
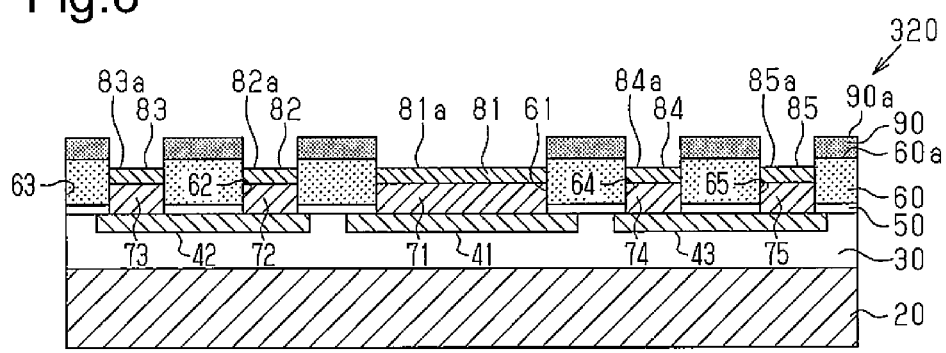
FIG. 6 is a schematic cross-sectional view of another example of a wiring substrate.

In a wiring substrate 320 illustrated in FIG. 6, the through wirings 71 to 75 and the pads 81 to 85 are formed in the through holes 61 to 65 of the insulation layer 60. That is, upper surfaces 81a to 85a of the pads 81 to 85 are located below the upper surface 60a of the insulation layer 60. The semiconductor device 100 may be mounted on the wiring substrate 320 at a lower position. This reduces the overall height of the semiconductor package. The wiring substrate 320 is obtained, for example, by adjusting the thicknesses of the through wirings 71 to 75. The thicknesses of the through wirings 71 to 75 are adjustable in accordance with, for example, a time of an electrolytic plating process or etching. FIG. 6 illustrates an example in which the upper surfaces 81a to 85a of the pads 81 to 85 are located below the upper surface 60a of the insulation layer 60. Alternatively, the upper surfaces 81a to 85a of the pads 81 to 85 may be located below an upper surface 90a of the protection layer 90 and above the upper surface 60a of the insulation layer 60.

Figure 7:
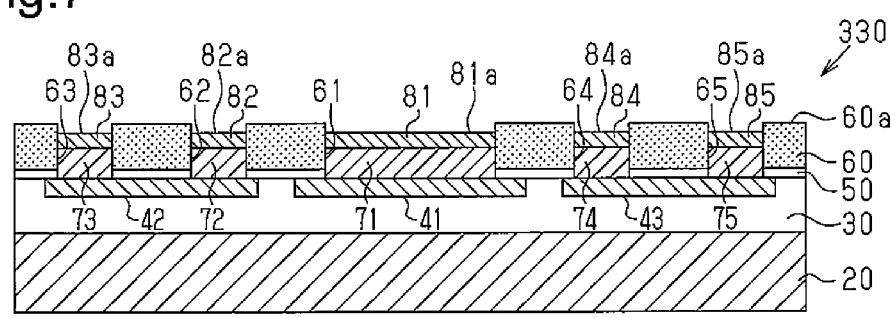
FIG. 7 is a schematic cross-sectional view of another example of a wiring substrate.

As illustrated in FIG. 7, the protection layer may be omitted from a wiring substrate 330. The semiconductor device 100 may be mounted on the wiring substrate 330 at a lower position. This reduces the overall height of the semiconductor package.

Figure 8:
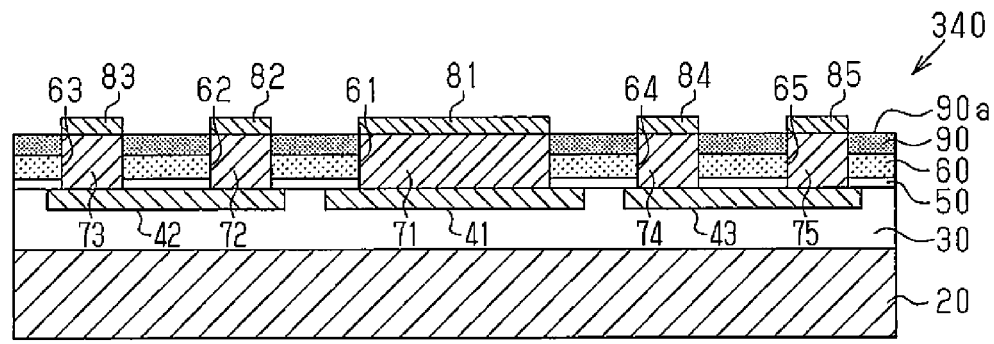
FIG. 8 is a schematic cross-sectional view of another example of a wiring substrate.

As illustrated in FIG. 8, a wiring substrate 340 includes the through holes 61 to 65 extending through the adhesive layer 50, the insulation layer 60, and the protection layer 90 in the thicknesswise direction. The through holes 61 to 65 are filled with the through wirings 71 to 75, respectively. The wiring substrate 340 includes the protection layer 90. The pads 81 to 85 project from the upper surface 90a of the protection layer 90. The wiring substrate 340 is obtained, for example, by the following procedures. Through holes are formed by extending through the two stacked insulation layers 60 in the thicknesswise direction. After the through wirings 71 to 75 are formed in the through holes, one of the insulation layers is removed, such as by delamination. Then, the protection layer 90 and the pads 81 to 85 are formed. In the same manner as the second embodiment, when the semiconductor device 100 is face-down-mounted on the wiring substrate 340, the connection terminal (e.g., bump) of the semiconductor device 100 may have a smaller projection. Additionally, when a light emitting semiconductor device is mounted, the protection layer 90 may function as a reflection film and efficiently reflect light emitted from the semiconductor device.

Figure 9:
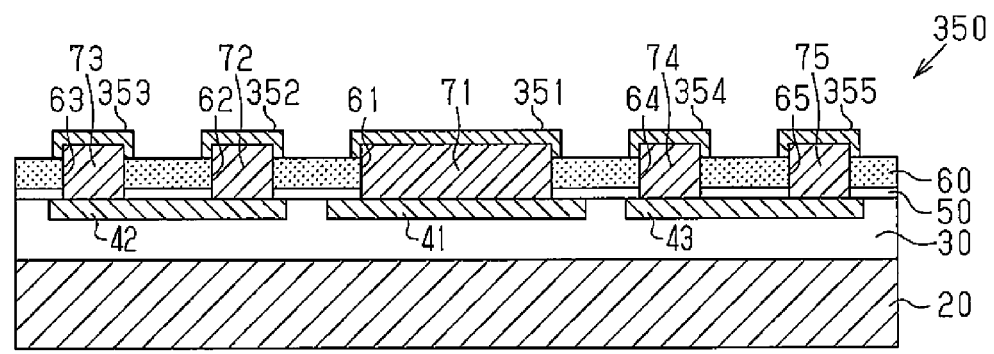
FIG. 9 is a schematic cross-sectional view of another example of a wiring substrate.

As illustrated in FIG. 9, the protection layer may be omitted from a wiring substrate 350. The wiring substrate 350 is obtained, for example, by the following procedures. Through holes are formed by extending through the two stacked insulation layers 60 in the thicknesswise direction. After the through wirings 71 to 75 are formed in the through holes, one of the insulation layers is removed, such as by delamination. Then, pads 351 to 355 are formed to cover the upper surfaces and upper end side surfaces of the through wirings 71 to 75. In the same manner as the second embodiment, when the semiconductor device 100 is face-down-mounted on the wiring substrate 350, the connection terminal (e.g., bump) of the semiconductor device 100 may have a smaller projection. Additionally, the pads 351 to 355 project upward from the protection layer 90. This reduces stress applied to the mounted semiconductor device, thereby limiting the disconnection of connecting portions.

Figure 10:
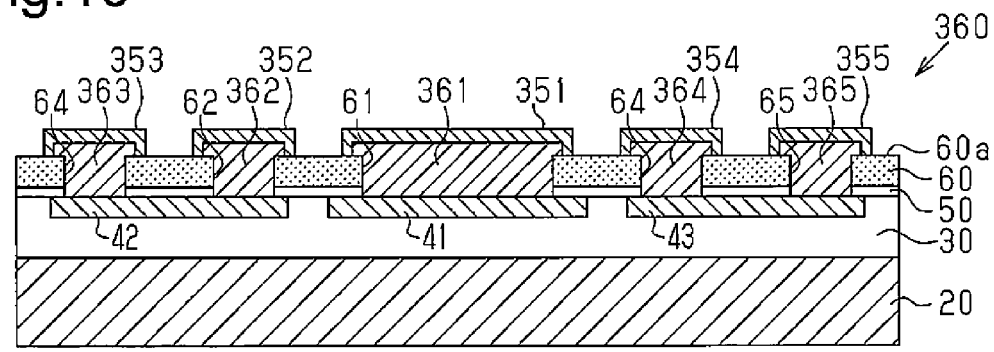
FIG. 10 is a schematic cross-sectional view of another example of a wiring substrate.

As illustrated in FIG. 10, the protection layer may be omitted from a wiring substrate 360. The wiring substrate 360 includes through wirings 361 to 365 projecting upward from the upper surface 60a of the insulation layer 60 and extending from the through holes 61 to 65 on the insulation layer 60 along the upper surface 60a of the insulation layer 60. In the wiring substrate 360, the through holes 61 to 65 are formed by extending through the single insulation layer 60 in the thicknesswise direction. In the electrolytic plating process, a time of a plating bath is adjusted so that the through wirings 361 to 365 fill the through holes 61 to 65 and project upward and sideward.

Figure 11:
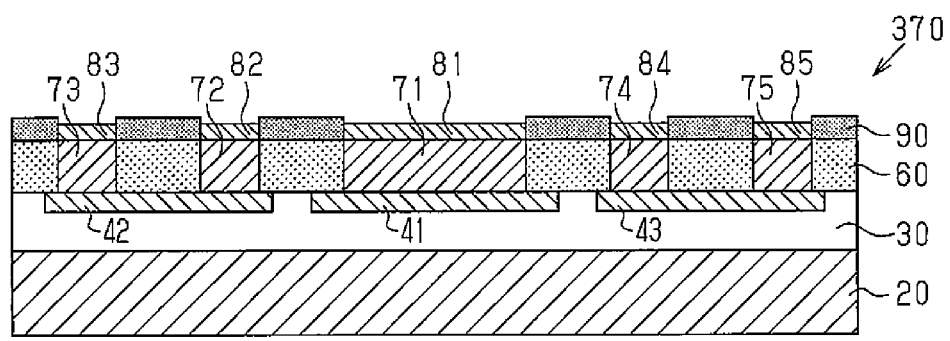
FIG. 11 is a schematic cross-sectional view of another example of a wiring substrate.

In a wiring substrate 370 illustrated in FIG. 11, the wiring layers 41 to 43 are in contact with the lower surface 60b of the insulation layer 60. That is, the adhesive layer 50 illustrated in FIG. 1B is omitted from the wiring substrate 370. The insulation layer 60 and the wiring layers 41 to 43 included in the wiring substrate 370 are obtained as follows. The insulation layer 60 is prepared. The insulation layer 60 is, for example, a polyimide resin film (e.g., polyimide tape). A layer of a metal, such as copper (Cu), is directly formed on the first surface of the insulation layer 60 using an electroless plating process, a sputtering process, an electrolytic plating process, or the like. The formed metal layer is patterned to form the wiring layers 41 to 43. As another example, a polyimide insulation resin is applied to a metal foil, such as a copper foil, to form the insulation layer 60. Then, the metal foil is patterned to form the wiring layers 41 to 43.

Figure 12:
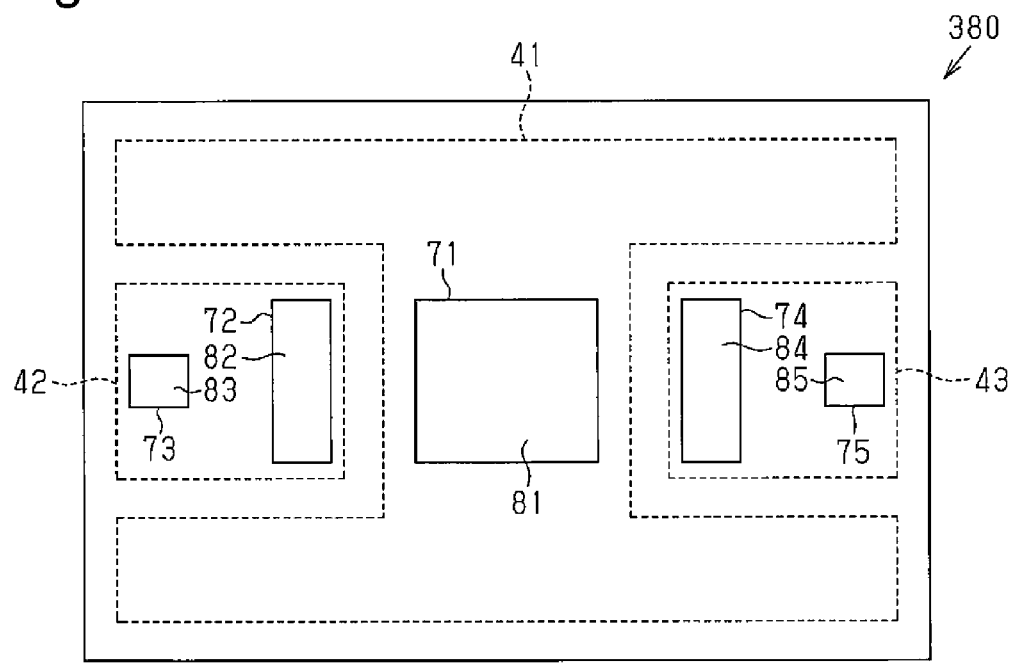
FIG. 12 is a schematic plan view of another example of a wiring substrate.

As illustrated in FIG. 12, the wiring layer 41 of a wiring substrate 380 is larger than the wiring layer 41 of the wiring substrate 10 illustrated in FIG. 1A in a plan view. The wiring layer 41 is also larger than the wiring layers 42, 43 in a plan view. For example, the wiring layer 41 may cover a region of the lower surface 50b of the adhesive layer 50 excluding a region in which the wiring layers 42, 43 are formed (refer to FIG. 1B). In FIG. 12, the wiring layer 41 is H-shaped. The wiring layers 42, 43 are arranged in recesses of the H shape facing each other. The thickness of the wiring layer 41 is the same as those of the wiring layers 42, 43. A contact area of the wiring layer 41 formed in this manner and the adhesive layer 30 (refer to FIG. 1B) is large compared to the first embodiment. Heat is dispersed in the plane direction of the wiring layer 41 and dissipated to the heat dissipation plate 20 through the adhesive layer 30. Thus, the heat is transmitted through a larger path in the adhesive layer 30. This efficiently dissipates the heat. Although not illustrated in the drawings, the through wiring 71 may be enlarged in correspondence with the wiring layer 41. Heat may be transmitted through the through wiring 71 in the plane direction of the wiring substrate 380 (direction of the upper surface of the wiring layer 41). This efficiently dissipates the heat.

Figure 13:
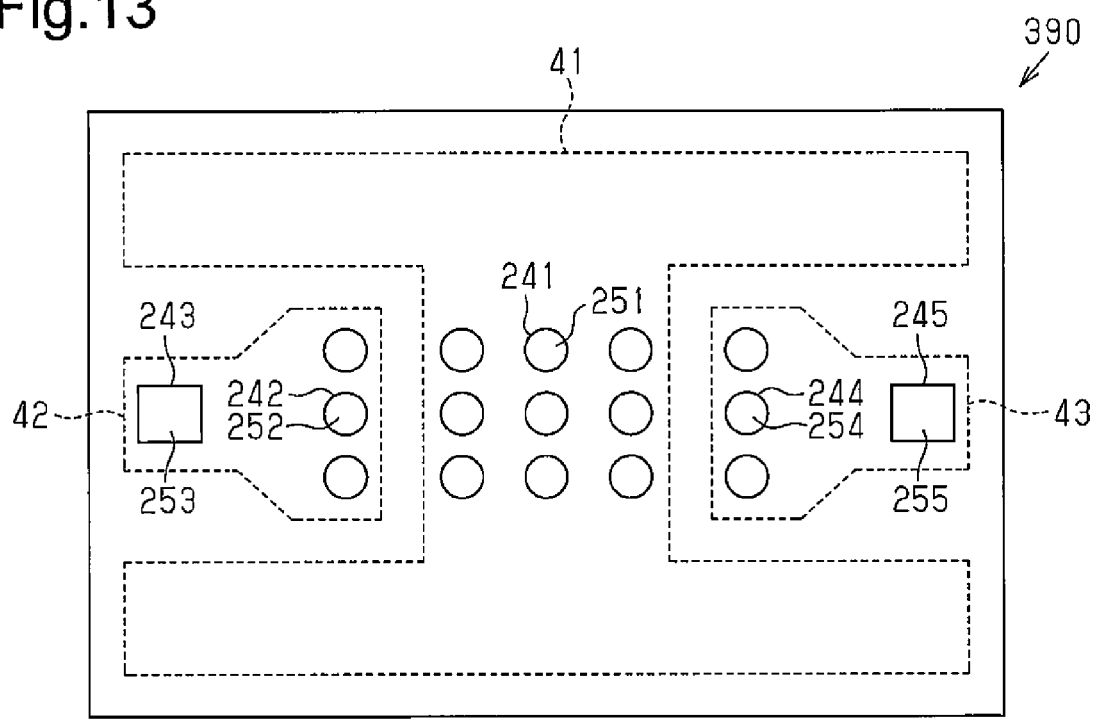
FIG. 13 is a schematic plan view of another example of a wiring substrate.

As illustrated in FIG. 13, a wiring substrate 390 corresponds to the wiring substrate 210 of the second embodiment. In the same manner as the wiring substrate 380 illustrated in FIG. 12, the wiring layer 41 of the wiring substrate 390 is larger than the wiring layer 41 of the wiring substrate 210 illustrated in FIG. 4A in a plan view. The wiring layer 41 of the wiring substrate 390 is also larger than the wiring layers 42, 43 in a plan view. Thus, the wiring substrate 390 may obtain the same advantages as the wiring substrate 380 illustrated in FIG. 12.

In the wiring substrate 390 illustrated in FIG. 13, the wiring layers 42, 43 are shaped in correspondence with the through wirings 242 to 245. In this manner, the shapes of the wiring layers 42, 43 are not limited to tetragons and thus may be changed.

It should be apparent to those skilled in the art that the present disclosure may be embodied in many other specific forms without departing from the scope of the disclosure. Particularly, it should be understood that the present disclosure may be embodied in the following forms.

More than one semiconductor device may be mounted on the wiring substrate of each embodiment.

A module including a semiconductor device may be mounted on the wiring substrate of each embodiment. One example of a module includes a semiconductor device mounted on a wiring formed on a substrate, a resin encapsulating the semiconductor device, and an external connection terminal exposed from the resin. Another example of a module includes a semiconductor device mounted on a wiring formed on a substrate, a reflector arranged around the semiconductor device mounted on the substrate, a resin encapsulating the semiconductor device and the reflector, and an external connection terminal exposed from the resin.

In the first embodiment and the corresponding modified examples, the wiring layer 41 and the through wiring 71 may be electrically connected to a semiconductor device. For example, in the same manner as a die pad (island) of a lead frame, the wiring layer 41 and the through wiring 71 are connected to a substrate (e.g., silicon substrate) of the semiconductor device using a conductive material, such as solder, so that the substrate of the semiconductor device has a predetermined potential (e.g., ground). Additionally, a semiconductor device may include terminals on the upper and lower surfaces (e.g., light emitting diode). In this case, the terminal on the lower surface is connected to the pad 81 using a conductive material, such as solder. The terminal on the upper surface is connected to, for example, the pad 84 using a bonding wire or the like. In the same manner as the wiring layer 43, the through wiring 75 and the pad 85 are arranged on the wiring layer 41. The semiconductor device (e.g., light emitting diode) is activated when power is supplied to the terminal on the upper surface and the terminal on the lower surface. In this manner, the wiring layer 41 and the through wiring 71 may be used as a path that sets the predetermined potential to the semiconductor device or a path that supplies power to the semiconductor device. The second embodiment and the corresponding modified examples may be connected in the same manner.

In the first embodiment, the second embodiment, and each modified example, the shape in a plan view of the wiring substrate is not limited to those illustrated in the drawings. Also, the shape in a plan view of the wiring layers, the through holes, the through wirings, and the like, which are included in the wiring substrate, are not limited to those illustrated in the drawings. Thus, various shapes may be used, such as a tetragon, a polygon, a circle, and a combined shape. Additionally, the layout may be determined in accordance with the shape.

The present examples and embodiments are to be considered as illustrative and not restrictive, and the disclosure is not to be limited to the details given herein, but may be modified within the scope and equivalence of the appended claims.

The invention claimed is:

1. A wiring substrate on which one of a semiconductor device and a module including a semiconductor device is mounted, the wiring substrate comprising:
    a heat dissipation plate;
    an adhesive layer arranged over the heat dissipation plate, wherein the adhesive layer has a first surface that is in contact with a surface of the heat dissipation plate, and a second surface that is located at an opposite side of the first surface; and
    a wiring portion arranged over the adhesive layer, wherein the wiring portion is in contact with the second surface of the adhesive layer; wherein
    the wiring portion includes:
        an insulation layer arranged on the heat dissipation plate with the adhesive layer located in between, wherein the insulation layer includes a first through hole and a second through hole that extend through the insulation layer in a thicknesswise direction;
        a first wiring layer and a second wiring layer arranged on a surface of the insulation layer in contact with the adhesive layer, wherein the first wiring layer and the second wiring layer are embedded in the adhesive layer;
        a first through wiring connected to the first wiring layer and thermally coupled to the semiconductor device, wherein the first through hole of the insulation layer is filled with the first through wiring;
        a second through wiring connected to the second wiring layer and electrically connected to the semiconductor device, wherein the second through hole of the insulation layer is filled with the second through wiring;
        a first pad that covers a surface of the first through wiring exposed from the insulation layer, the first pad being provided in the surface opposite to the surface of the first through wiring in contact with the first wiring layer; and
        a second pad that covers a surface of the second through wiring exposed from the insulation layer, the second pad being provided in the surface opposite to the surface of the second through wiring in contact with the second wiring layer, wherein
        the surface of the heat dissipation plate is separated from surfaces of the first wiring layer and the second wiring layer, and
        the adhesive layer fills from the surface of the heat dissipation plate to the surfaces of the first wiring layer and the second wiring layer.

2. The wiring substrate according to claim 1, wherein the first through wiring and the first wiring layer are configured not to be electrically connected to the semiconductor device.

3. The wiring substrate according to claim 1, wherein the first wiring layer is larger than the first through wiring in a plan view.

4. The wiring substrate according to claim 1, wherein the first through wiring is larger than one of the semiconductor and the module in a plan view.

5. The wiring substrate according to claim 1, wherein
the first through wiring is one of a plurality of first through wirings,
the first pad is one of a plurality of first pads,
the first through wirings are connected to the same first wiring layer,
each of the first pads is thermally coupled to the semiconductor device via a first bump,
the second through wiring is one of a plurality of second through wirings,
the second pad is one of a plurality of second pads,
the second through wirings are connected to the same second wiring layer, and
each of the second pads is electrically connected to the semiconductor device via a second bump.

6. The wiring substrate according to claim 1, wherein the adhesive layer includes:
a first adhesive layer that bonds the first wiring layer and the second wiring layer to the insulation layer; and
a second adhesive layer that bonds the first adhesive layer, the first wiring layer, and the second wiring layer to the heat dissipation plate.

7. The wiring substrate according to claim 1, comprising a protection layer arranged on the insulation layer, wherein the protection layer includes:
a first opening that exposes the first pad; and
a second opening that exposes the second pad.

8. The wiring substrate according to claim 7, wherein
the semiconductor device includes a light emitting device, and
the protection layer includes a reflection film.

9. The wiring substrate according to claim 1, wherein the first wiring layer and the first through wiring are electrically connected to the semiconductor device.

* * * * *